(12) United States Patent
Wu et al.

(10) Patent No.: US 11,621,350 B2
(45) Date of Patent: Apr. 4, 2023

(54) TRANSISTOR STRUCTURE AND METHOD WITH STRAIN EFFECT

(71) Applicant: Taiwan Semiconductor Manufacturing Co., Ltd., Hsinchu (TW)

(72) Inventors: Xusheng Wu, Hsinchu (TW); Youbo Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/403,402

(22) Filed: Aug. 16, 2021

(65) Prior Publication Data

US 2021/0376149 A1 Dec. 2, 2021

Related U.S. Application Data

(62) Division of application No. 16/573,898, filed on Sep. 17, 2019, now Pat. No. 11,094,821.

(51) Int. Cl.
| | |
|---|---|
| H01L 29/78 | (2006.01) |
| H01L 21/02 | (2006.01) |
| H01L 21/311 | (2006.01) |
| H01L 29/66 | (2006.01) |
| H01L 29/40 | (2006.01) |

(52) U.S. Cl.
CPC ...... *H01L 29/7843* (2013.01); *H01L 21/0217* (2013.01); *H01L 21/02164* (2013.01); *H01L 21/02211* (2013.01); *H01L 21/02236* (2013.01); *H01L 21/02271* (2013.01); *H01L 21/31116* (2013.01); *H01L 29/401* (2013.01); *H01L 29/6656* (2013.01); *H01L 29/66545* (2013.01); *H01L 29/66795* (2013.01); *H01L 29/7851* (2013.01); *H01L 21/02255* (2013.01)

(58) Field of Classification Search
CPC ......... H01L 29/66795; H01L 21/02211; H01L 29/6656; H01L 21/02271
See application file for complete search history.

(56) References Cited

U.S. PATENT DOCUMENTS

| | | | |
|---|---|---|---|
| 8,836,016 | B2 | 9/2014 | Wu et al. |
| 8,841,701 | B2 | 9/2014 | Lin et al. |
| 8,847,293 | B2 | 9/2014 | Lee et al. |
| 8,853,025 | B2 | 10/2014 | Zhang et al. |
| 8,962,400 | B2 | 2/2015 | Tsai et al. |
| 9,093,514 | B2 | 7/2015 | Tsai et al. |

(Continued)

*Primary Examiner* — Changhyun Yi
(74) *Attorney, Agent, or Firm* — Haynes and Boone, LLP

(57) ABSTRACT

A semiconductor structure includes a gate stack on a semiconductor substrate and an etch stop layer disposed on the gate stack and the semiconductor substrate. The etch stop layer includes a first portion disposed on sidewalls of the gate stack and a second portion disposed on a top surface of the semiconductor substrate within a source/drain region. The semiconductor structure further includes a dielectric stress layer disposed on the second portion of the etch stop layer and being free from the first portion of the etch stop layer other than at a corner area formed by the first portion intersecting the second portion. The dielectric stress layer is different from the etch stop layer in composition and is configured to apply a compressive stress to a channel region underlying the gate stack.

20 Claims, 13 Drawing Sheets

(56) References Cited

U.S. PATENT DOCUMENTS

| | | | |
|---|---|---|---|
| 9,236,267 B2 | 1/2016 | De et al. | |
| 9,245,805 B2 | 1/2016 | Yeh et al. | |
| 9,520,482 B1 | 12/2016 | Chang et al. | |
| 9,576,814 B2 | 2/2017 | Wu et al. | |
| 2015/0061042 A1* | 3/2015 | Cheng | H01L 21/28088 |
| | | | 257/412 |
| 2016/0104673 A1* | 4/2016 | Tung | H01L 21/76897 |
| | | | 257/288 |

* cited by examiner

TRANSISTOR STRUCTURE AND METHOD WITH STRAIN EFFECT

PRIORITY

This application is a divisional of U.S. application Ser. No. 16/573,898, filed Sep. 17, 2019, the entire disclosure of which is incorporated herein by reference.

BACKGROUND

An integrated circuit is formed on a semiconductor substrate and includes various devices, such as transistors, diodes, and/or resistors, configured and connected together to a functional circuit. Especially, the integrated circuit further includes field-effect transistors, such as metal-oxide-semiconductor FETs (MOSFETs) or complimentary MOSFETs, wherein each includes a gate electrode to control the channel region of the corresponding FET. FET performance is improved through various technologies. For examples, high k dielectric material and metal are adopted to form a gate stack. Fin-like active regions are used to enhance the coupling between the gate electrode and the channel region. In another example, strain effect is employed to apply proper stress to the channel region to increase the carrier mobility and device speed. However, the stress applied to the channel may have cause other issues such as gate dimension changes and gate filling issues. Therefore, it is therefore desired to have a new device structure and the method making the same to address the above concerns with enhanced circuit performance.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
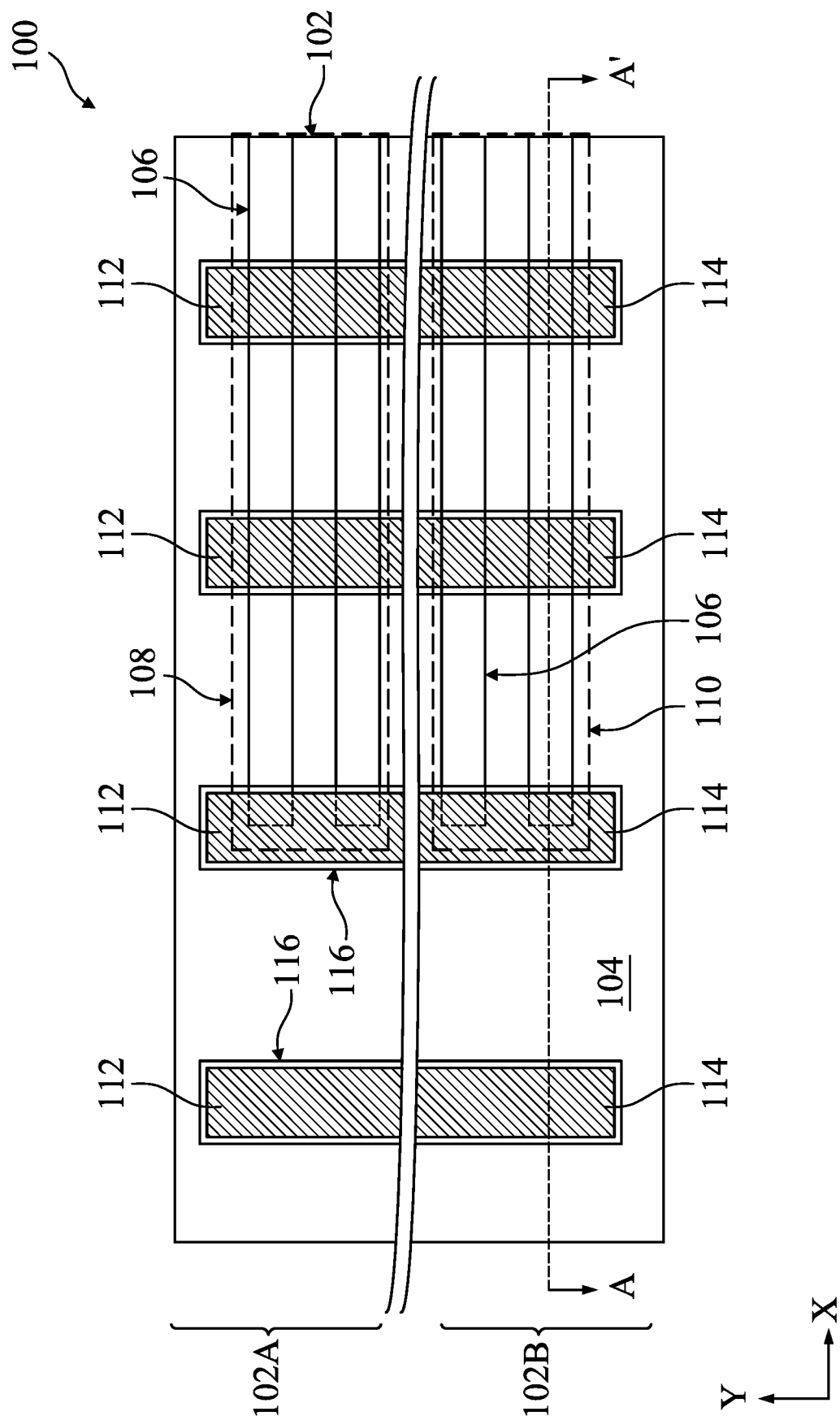
FIG. 1 is a top view of a semiconductor device structure constructed according to various aspects of the present disclosure in one embodiment.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

Figure 10:
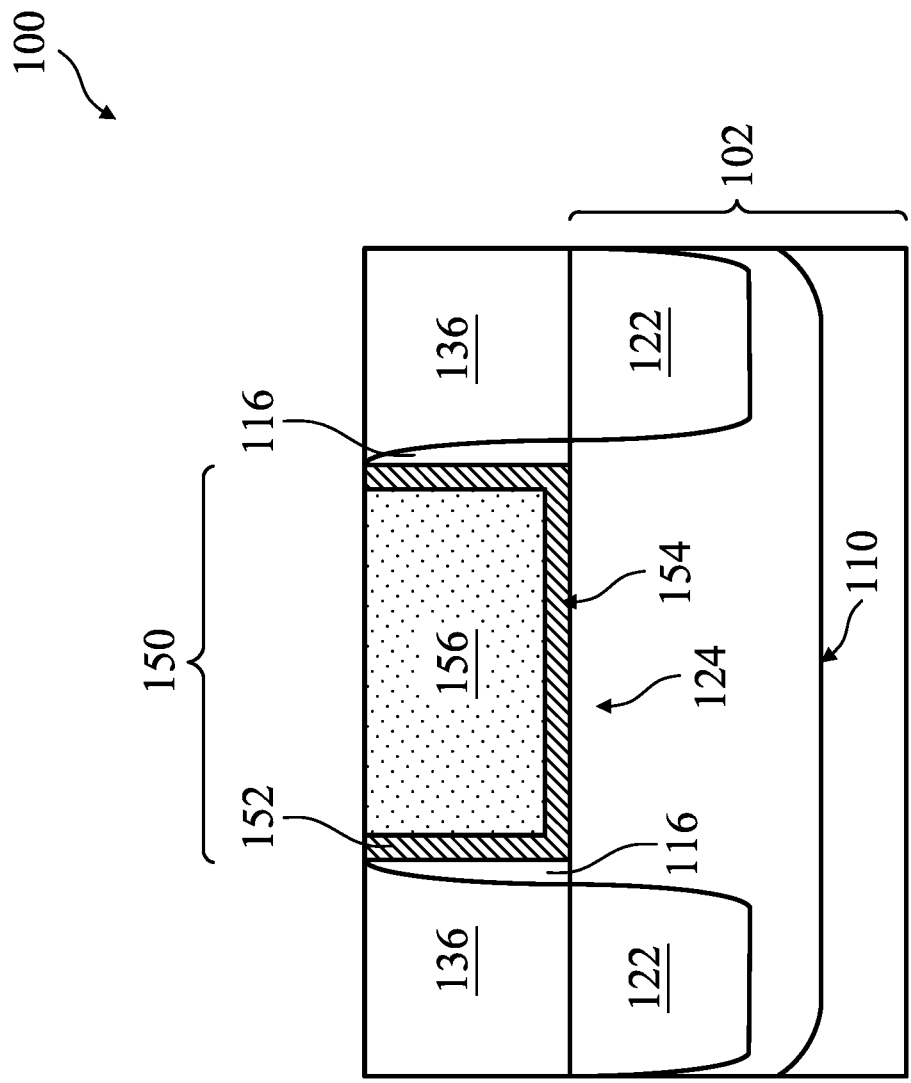
FIG. 10 is a sectional view of the semiconductor structure of FIG. 9, in portion, constructed in accordance with some embodiments.
Figure 11:
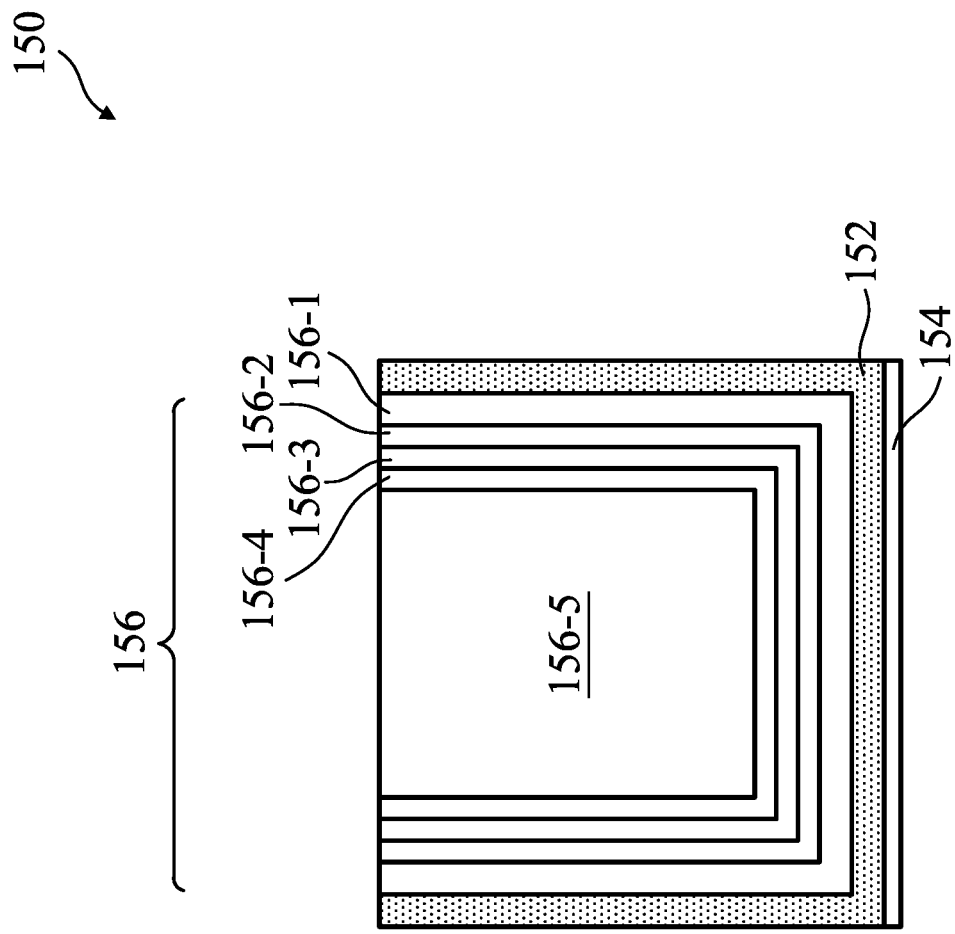
FIG. 11 is a sectional view of the metal gate stack in the semiconductor structure of FIG. 10 constructed in accordance with various embodiments.
Figure 12:
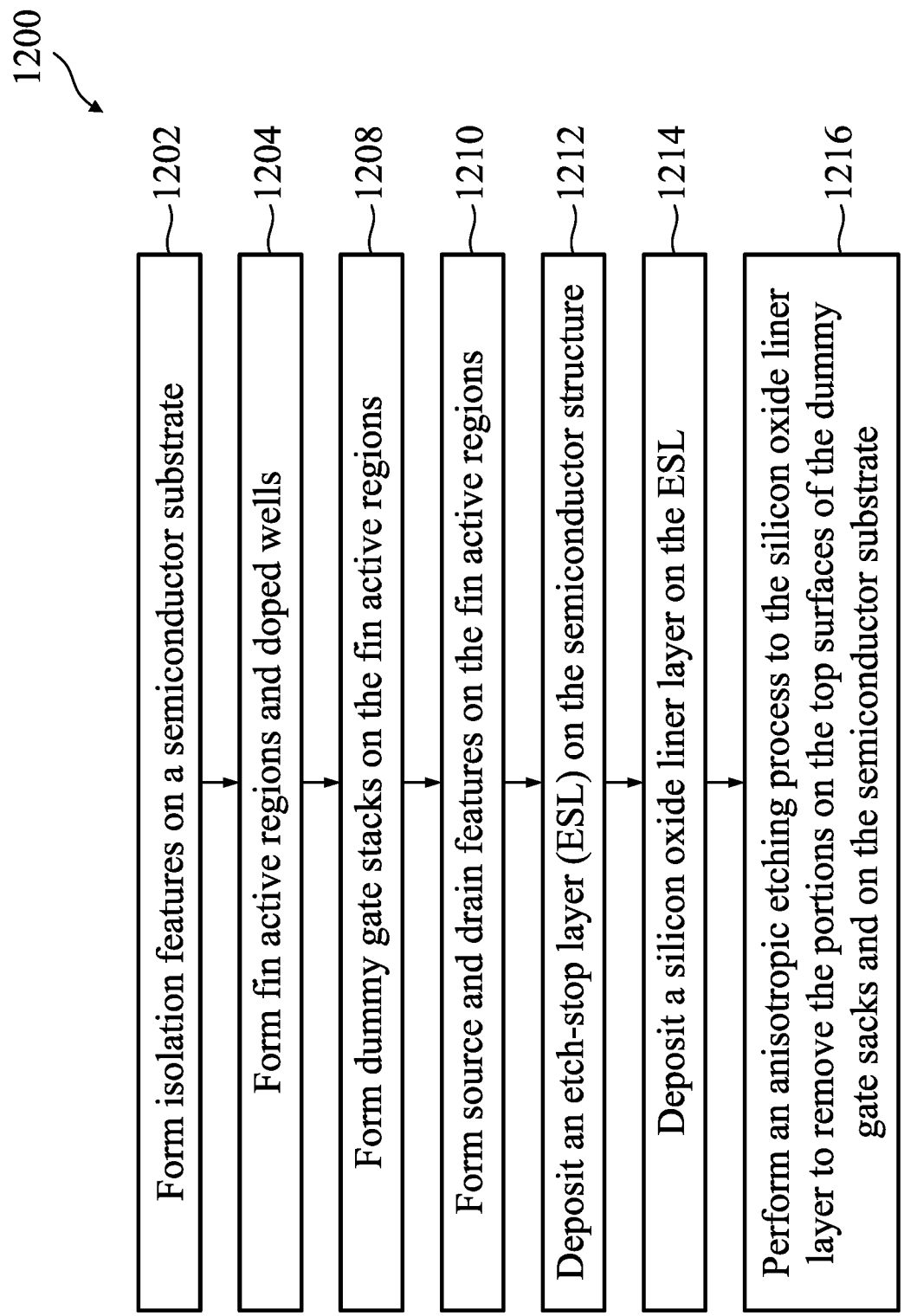
FIGS. 12 and 13 illustrate a flowchart of a method fabricating the semiconductor structure, in accordance with some embodiments.
Figure 13:
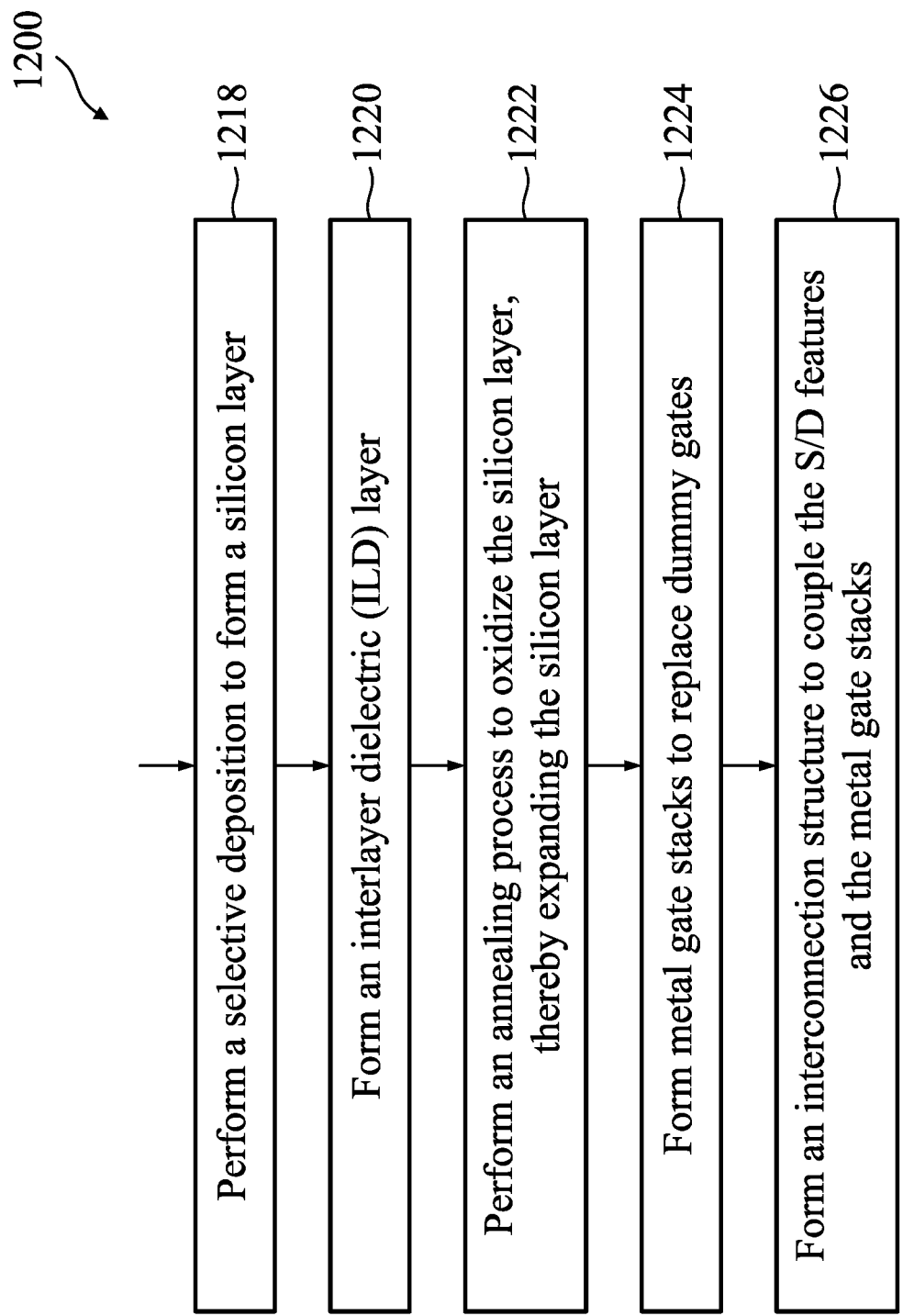

FIG. 1 is a top view of a semiconductor structure (or a work piece) 100 constructed according to various aspects of the present disclosure in one embodiment. FIGS. 2-9 are sectional views of the semiconductor structure 100, in portion, along the dashed lines AA' at various fabrication stages in accordance with some embodiments. FIG. 10 is a sectional view of the semiconductor structure 100, in portion, and FIG. 11 is a sectional view of the metal gate stack in the semiconductor structure 100, constructed in accordance with various embodiments. FIGS. 12 and 13 illustrate a flowchart of a method 1200 fabricating the semiconductor structure 100 in accordance with some embodiments. The semiconductor structure 100 and the method 1200 making the same are described with reference to FIGS. 1 through 13. In the present embodiment, the semiconductor structure 100 is formed on fin active regions and includes fin field-effect transistors (FinFETs). In some embodiments, the semiconductor structure 100 may be formed on flat fin active regions and includes plain field-effect transistors (FETs). In some embodiments, the semiconductor structure 100 may be formed on a nano-structure with multiple channel regions vertically stacked on. The semiconductor structure 100 includes a p-type FET, a complementary MOSFET having both an n-type FET (nFET) and a p-type FET (pFET).

The semiconductor structure 100 includes a substrate 102. In the present embodiment, the substrate 102 is a semiconductor substrate and includes a bulk silicon substrate. Alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods.

The substrate 102 also includes various isolation features, such as isolation features 104 formed on the substrate 102 and defining various active regions 106 on the substrate 102. The isolation feature 104 utilizes isolation technology, such as local oxidation of silicon (LOCOS) and/or shallow trench isolation (STI), to define and electrically isolate the various active regions. The isolation feature 104 includes silicon oxide, silicon nitride, silicon oxynitride, other suitable dielectric materials, or combinations thereof. The isolation feature 104 is formed by any suitable process. As one example, forming STI features includes a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multi-layer structure, such as a thermal oxide liner layer and filling layer(s) of silicon nitride or silicon oxide.

The active regions 106 are those regions with semiconductor surface wherein various doped features are formed and configured to one or more device, such as a diode, a transistor, and/or other suitable devices. The active regions may include a semiconductor material similar to that (such as silicon) of the bulk semiconductor material of the substrate 102 or different semiconductor material, such as silicon germanium (SiGe), silicon carbide (SiC), or multiple semiconductor material layers (such as alternatively silicon and silicon germanium layers) formed on the substrate 102 by epitaxial growth, for performance enhancement, such as strain effect to increase carrier mobility. The active regions 106 each have an elongated shape oriented in the X direction. The X direction is orthogonal to the Y direction, both X and Y directions defining the top surface of the substrate 102. The top surface has a normal direction along the Z direction, which is orthogonal to both X and Y directions.

Figure 2:
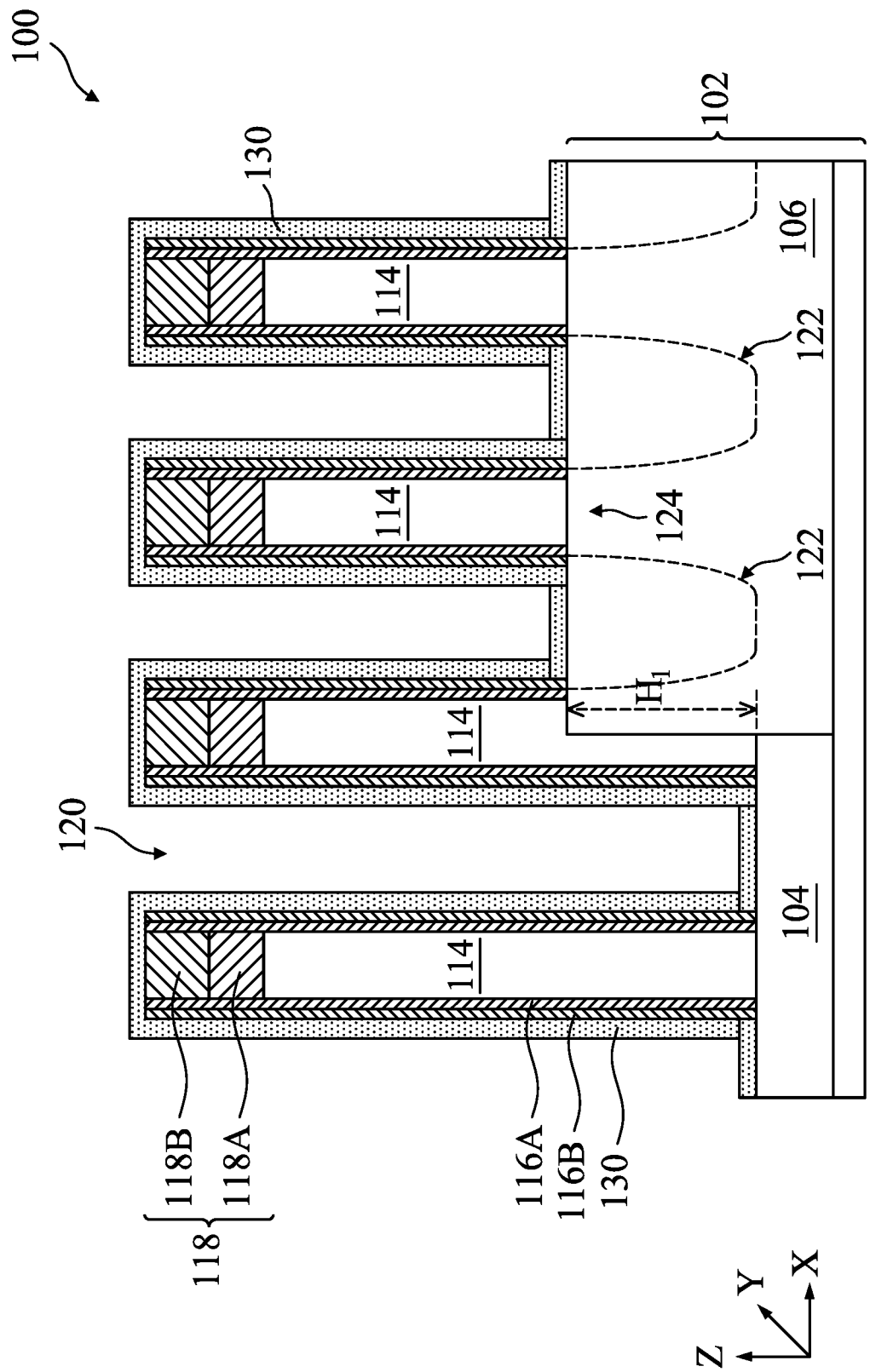
FIGS. 2, 3, 4, 5, 6, 7, 8 and 9 are sectional views of the semiconductor structure of FIG. 1 taken along the dashed lines AA' at various fabrication stages, in accordance with some embodiments.

In the present embodiment, the active regions 106 are three dimensional, such as fin active regions extruded above the substrate 102, particularly, extended above the isolation features 104. The fin active regions are extruded from the substrate 102 and provide three-dimensional profiling for more effective coupling between the channel region (or simply referred to as channel) and the gate electrode. In the present embodiment, the fin active regions 106 are higher than the isolation features 104 along the Z direction by a dimension $H_1$ (as illustrated in FIG. 2), ranging between 40 nm and 150 nm according to some examples. The fin active regions may be formed by selective etching to recessing the isolation features 104, or selective epitaxial growth to grow active regions with a semiconductor same or different from that of the substrate 102, or a combination thereof. Accordingly, the FETs formed on the fin active regions 106 are referred to FinFETs. The semiconductor structure 100 includes a first region 102A for n-type FinFETs and a second region 102B for p-type FinFETs.

The substrate 102 further includes various doped features, such as n-type doped wells, p-type doped wells, source and drain, other doped features, or a combination thereof configured to form various devices or components of the devices. In some embodiments, the substrate 102 may include a doped well 108 of a first-type in the first region 102A and a doped well 110 of a second-type in the second region 102B, as illustrated in FIG. 1. The doped well 108 is doped with a p-type dopant (therefore referred to as p-well). The dopant (such as boron) in the p-well 108 may be introduced to the fin active regions 106 by ion implantation or other suitable technology. For example, the p-well 108 may be formed by a procedure that includes forming a patterned mask with an opening on the substrate 102 wherein the opening defines the region for the p-well 108; and performing an ion implantation to introduce a p-type dopant (such as boron) into the fin active regions 106 using the patterned mask as an implantation mask. The patterned mask may be a patterned resist layer formed by lithography or a pattern hard mask formed by deposition, lithography process and etching.

Similarly, the doped well 110 in the second region 102B is the second-type, which is opposite to the first-type in conductivity. In the present example, the doped well 110 is doped with an n-type dopant (therefore referred to as n-well). The dopant (such as phosphorous) in the n-well 110 may be introduced to the fin active regions 106 by ion implantation or other suitable technology.

The semiconductor structure 100 further includes first gate stacks 112 disposed in the first region 102A and having an elongated shape oriented in the Y direction. The first gate stacks 112 includes a gate dielectric layer and a gate electrode formed thereon. Gate spacer 116 is further formed on the sidewalls of the first gate stacks 112. In some examples, the gate spacer 116 includes silicon oxide, silicon nitride, silicon oxynitride, other suitable dielectric material or a combination thereof. The gate spacer 116 may have a multilayer structure and may be formed by depositing dielectric material and then anisotropic etching, such as plasma etching. For example, as illustrated in FIG. 2, the gate spacer 116 includes a first dielectric film 116A and a second gate dielectric film 116B different from the first gate dielectric film 116A in composition. In some examples, the first dielectric film 116A includes silicon oxide and the second gate dielectric film 116B includes silicon nitride. In some embodiments, the gate spacer films 116A and 116B may include a low-K dielectric material, silicon carbon oxynitride (SiCON), silicon oxynitride (SiON), or a combination thereof.

The semiconductor structure 100 further includes a second gate stacks 114 disposed in the second region 102B and having an elongated shape oriented in the Y direction. The second gate stacks 114 include a gate dielectric layer and a gate electrode formed thereon. In the present embodiment, the second gate stacks 114 are different from the first gate stacks 112 in composition, structure or both. For example, the first and second gate stacks may use different work function metals for optimized and reduced threshold voltages. The gate spacer 116 are formed on the sidewalls of the second gate stacks 114 as well. In the present embodiment, the first gate stacks 112 and the second gate stacks 114 are dummy gate stacks. The final gate stacks having high-k dielectric material and metal will be formed at a late stage by a gate-last process, in which dummy gate stacks are formed first and then replaced by metal gate stacks by a procedure that includes etching, deposition and polishing.

The gate stacks 112 and 114 are formed by deposition and patterning. For example, various gate materials are deposited and are further patterned by a lithography process and etching. A hard mask 118 may be employed during the patterning the gate materials. In this case, a patterned photoresist layer is formed on the hard mask 118, an etching process is applied to the hard mask to transfer the pattern from the photoresist layer to the hard mask 118. Then, another etching process is applied to the gate materials using the patterned hard mask 118 as an etch mask. The hard mask 118 may include one or more suitable material to resist the etching process applied to the gate materials. In some examples, the hard mask 118 includes a first dielectric material film 118A (such as silicon oxide) and a second dielectric material film 118B (such as silicon nitride). Gate gaps 120 are defined in the regions between the gate stacks.

The semiconductor structure 100 includes source/drain (S/D) features (or simply referred to as source and drain) 122 formed on the fin active regions 106 on opposite sides of the gate stacks (such as the gate stacks 114 in FIG. 2). In FIG. 2, only the second region 102B for pFETs is illustrated, the following description focuses on the second region 102B. However, it is not intended to be limiting. The S/D features 122 are doped with n-type dopant (such as phosphorous). The S/D features 122 may be formed by ion implantation and/or diffusion. Other processing steps may be further included to form the S/D features. For example, a rapid thermal annealing (RTA) process may be used to activate the implanted dopant. The S/D features may have different doping profiles formed by multi-step implantation. For example, additional doping features such as light doped drain (LDD) or double diffused drain (DDD) may be included. Also, the S/D features 122 may have different structures, such as raised, recessed, or strained. For example, the formation of the S/D features may include an etching to recess the source and drain regions; epitaxial growth to form epitaxial S/D features with in-situ doping; and an annealing for activation.

The semiconductor structure 100 includes a channel region 124 defined on the fin active regions 106 and underlying the gate stacks 114. The channel region 124 is interposed between the S/D features 122. The channel region 124 may be tuned for proper threshold voltage or other parameters by ion implantation. The channel region 124 has a same type of dopant (n-type) to that of the n-well 110 (not shown in FIG. 2) but with a greater doping concentration, depending on the application and device specification.

In the present embodiment, the S/D features 122 are epitaxial source and drain. The epitaxial S/D features 122 may be formed by selective epitaxial growth for straining effect with enhanced carrier mobility and device performance. The S/D features 122 are formed by one or more epitaxial growth (epitaxial process), whereby silicon (Si) features, silicon germanium (SiGe) features, silicon carbide (SiC) features, and/or other suitable semiconductor features are grown in a crystalline state on the fins within the source/drain regions (such as defined by a patterned hard mask). In furtherance of the embodiment, the S/D features 122 in the second region 102B for pFETs includes silicon germanium to apply compressive stress to the channel region 124 for enhanced carrier mobility of the corresponding pFET. During the formation of the S/D features 122, the gate hard mask 118 may be partially lost.

In an alternative embodiment, an etching process is applied to recess portions of the first active region 106 within the source and drain regions before the epitaxy growth. The etching process may also remove any dielectric material disposed on the source/drain regions, such as during the formation of the gate sidewall features. Suitable epitaxy processes include CVD deposition technologies (e.g., vapor-phase epitaxy (VPE) and/or ultra-high vacuum CVD (UHV-CVD), molecular beam epitaxy, and/or other suitable processes. The S/D features 122 may be in-situ doped during the epitaxy process by introducing doping species, such as p-type dopants (e.g., boron or $BF_2$) for the S/D features 122.

Referring to FIG. 2, a contact etch-stop layer (or simply etch-stop layer or ESL) 130 is deposited on the gate stacks and the substrate 102. The ESL 130 is a dielectric material layer conformally formed on the semiconductor structure 100. In the present embodiment, the ESL 130 includes silicon nitride. The ESL 130 has a suitable thickness to function properly for etch stop, such as at later stage to form contacts. The ESL 130 may not survive the etching process if it is too thin or may substantially reduce the dimension of the gate gaps 120 if it is too thick. In some examples, the thickness of the ESL 130 ranges between 1 nm and 10 nm. The ESL 130 may be formed by atomic layer deposition (ALD) or other suitable deposition technique, such as chemical vapor deposition (CVD).

Figure 3:
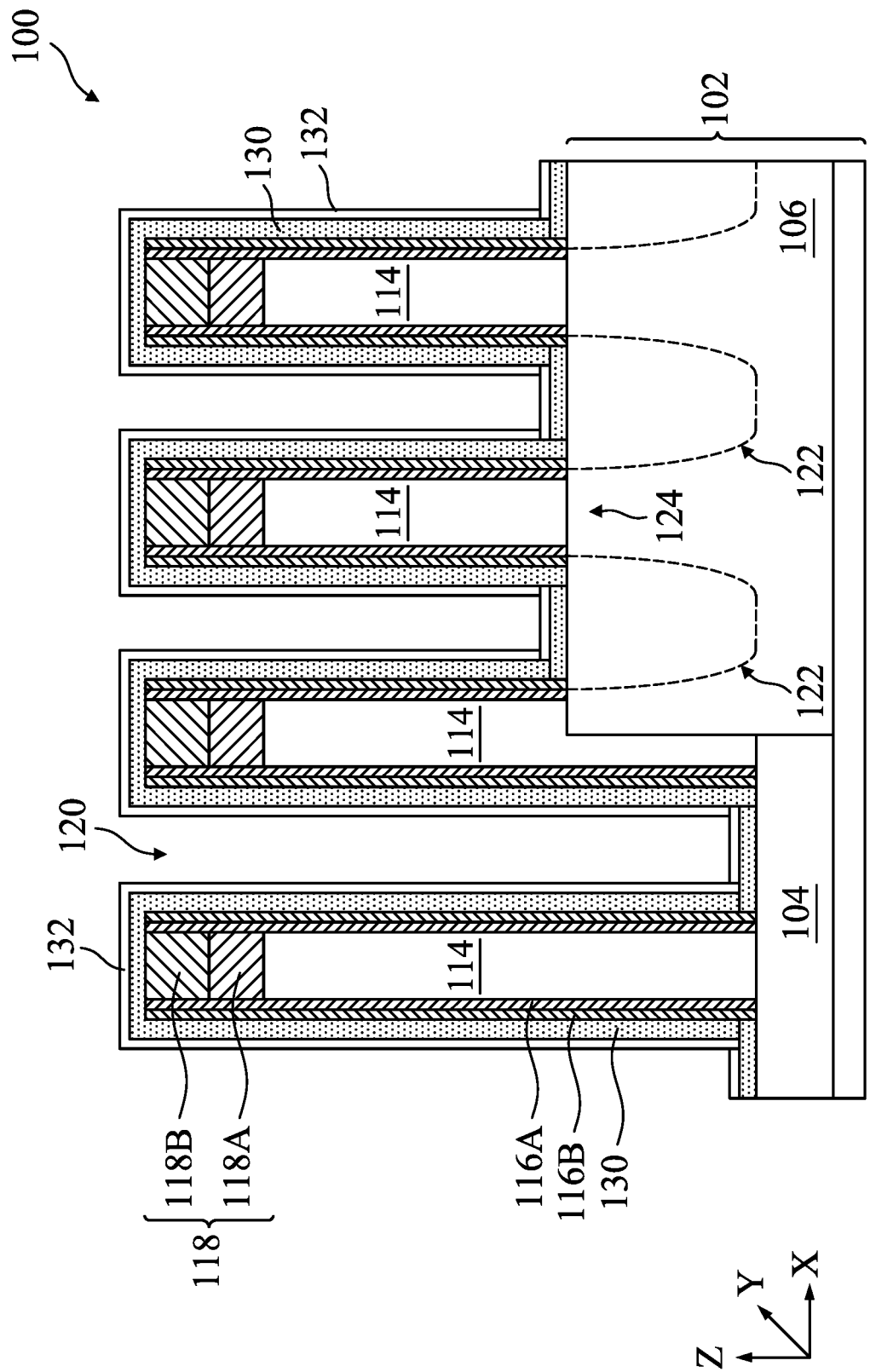

Referring to FIG. 3, a liner layer 132 is deposited on the semiconductor structure 100, especially on the ESL 130. The liner layer 132 is conformally formed on the ESL 130. The liner layer 132 is different from the ESL 130 in composition so that a subsequent deposition can be tuned to be selective to those surfaces. In the present embodiment, the liner layer 132 is silicon oxide ($SiO_2$). The liner layer 132 has a suitable thickness to effectively cause subsequent selective deposition. In some examples, the thickness of the liner layer 132 ranges between 1 nm and 5 nm. The liner layer 132 may be formed by ALD or other suitable deposition technique, such as CVD.

Figure 4:
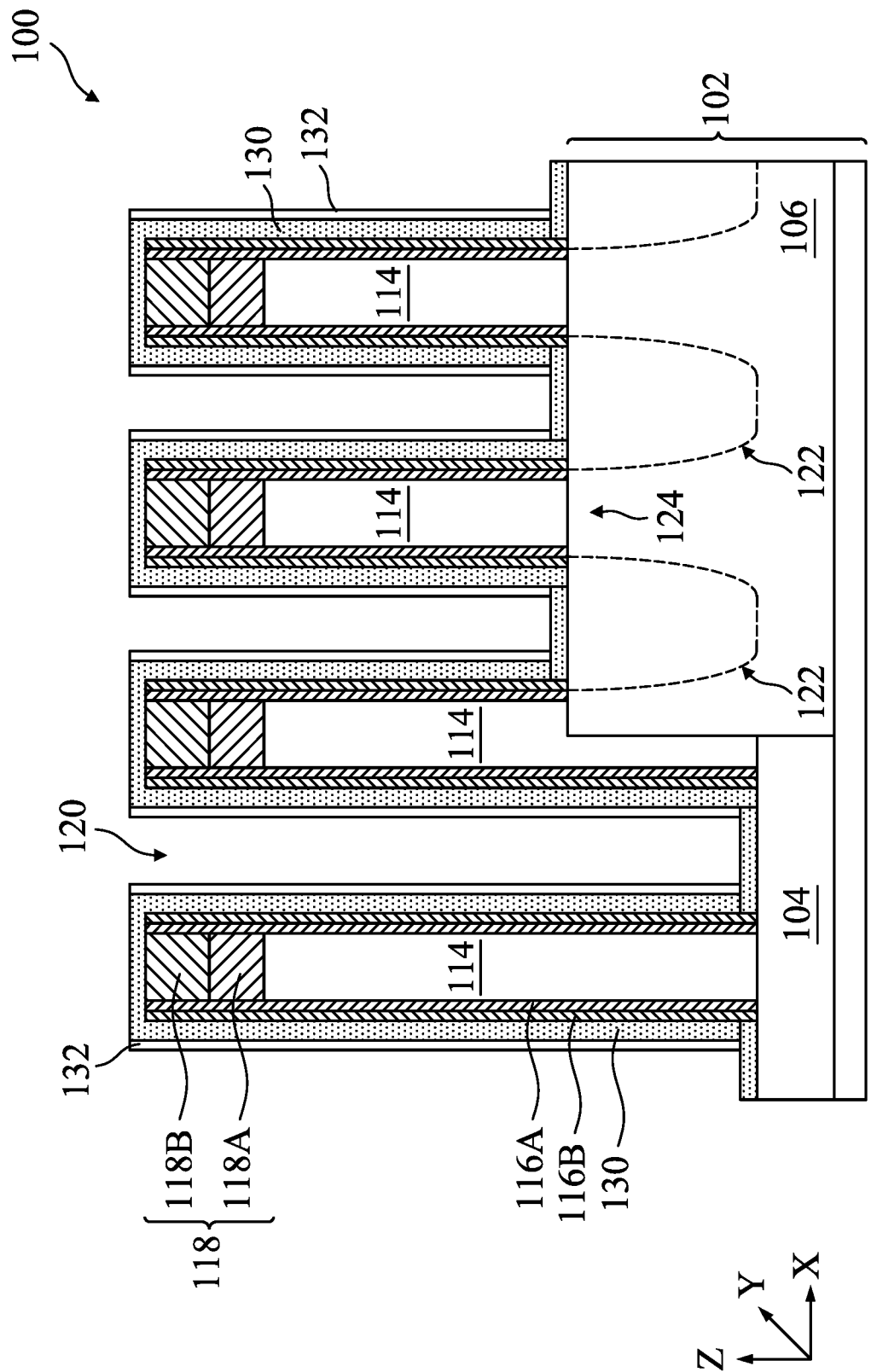

Referring to FIG. 4, an anisotropic etching process, such as dry etch, is applied to the liner layer 132 to remove the portions of the liner layer 132 on the top surfaces of the gate stacks 114 and on the top surfaces of the fin active regions 106 within the gate gaps 120 while the portions of the liner layer 132 on the sidewalls of the ESL 130 remain. For example, the anisotropic etching process includes plasma etch using fluorine-containing chemical, such as $CF_4$, $SF_6$, $NF_3$, $CH_2F_2$ or a combination thereof. The etch gas may additionally include hydrogen ($H_2$), nitrogen ($N_2$) or both. After the anisotropic etching process, the semiconductor structure 100 includes two surfaces, the surfaces of the ESL 130 and the surfaces of the liner layer 132 with different compositions and respective characteristics.

Figure 5:
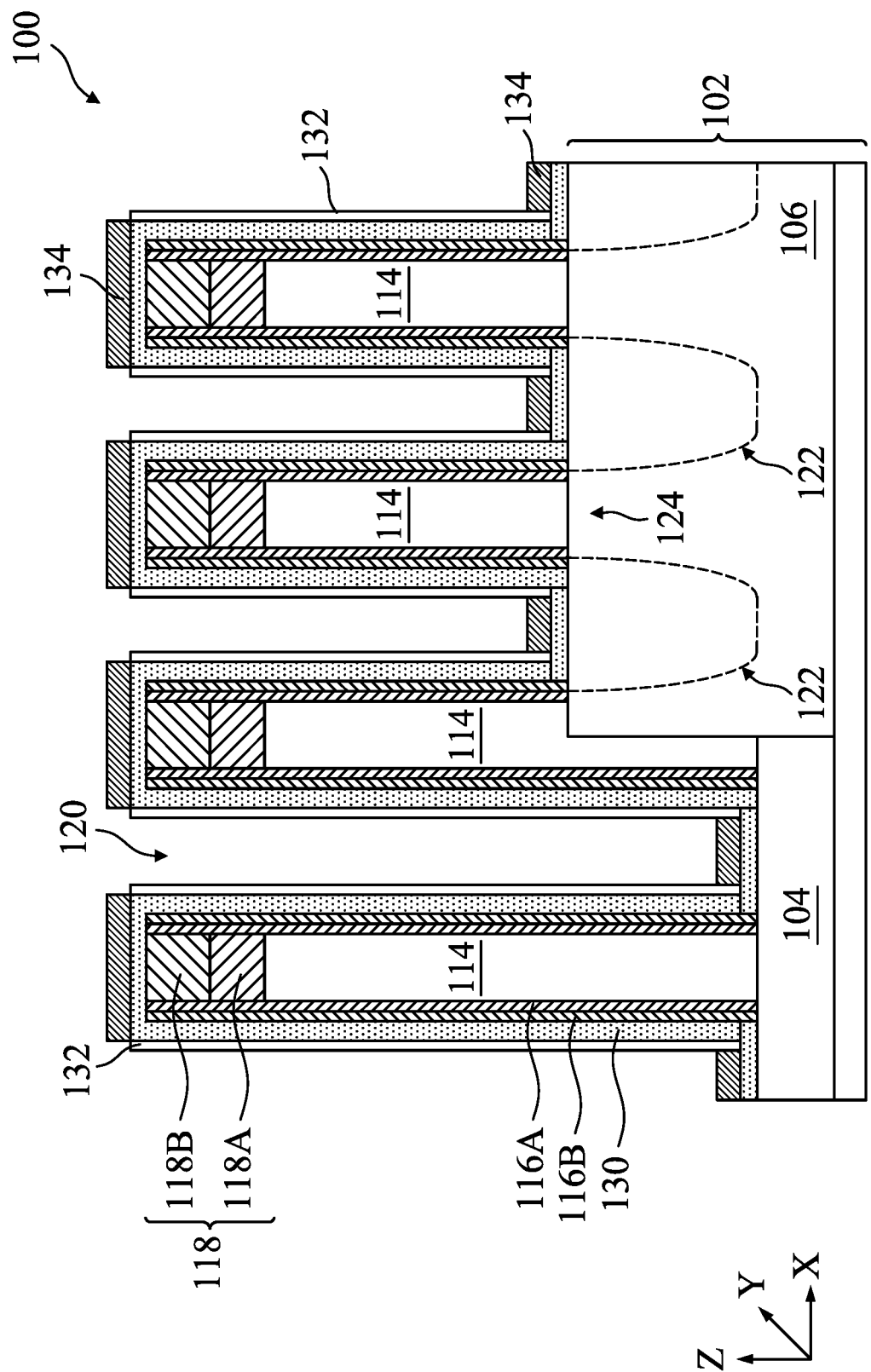

Referring to FIG. 5, a selective deposition is implemented to deposit a silicon layer 134 selectively on the surfaces of the ESL 130 but not on the surfaces of the liner layer 132. The selective deposition process may include two steps, such as pre-treating and depositing, according to some embodiments. The pre-treating step removes native oxide from the ESL 130, and the depositing step deposits silicon selectively on the ESL 130. In other embodiments, the pre-treating step is implemented in a gas mixture of one fluorine-containing gas (such as HF, $F_2$, $NF_3$, or a combination thereof) and at least one assisting gas (such as $H_2$, $N_2$, $O_2$, $NH_3$, $Cl_2$, Ar, He, or a combination thereof). The silicon layer 134 is deposited as amorphous silicon with a gas mixture consisting of at least one precursor and one assisting gas by a suitable technique, such as CVD, plasma-enhanced CVD (PECVD), atomic layer deposition (ALD), plasma-enhanced ALD (PEALD), other suitable method, or a combination thereof. In various examples, the precursor includes Silane, Di-Silane, Di-Chloride Silane, Hexachlorodisilane or a combination thereof. The assisting gas includes $H_2$, $N_2$, $O_2$, $NH_3$, HF, $F_2$, $NF_3$, $Cl_2$, Ar, He, or a combination thereof. In some embodiments, the gas mixture of is applied in plasma, or alternatively without plasma. The deposition is controlled with deposition condition for enhanced deposition selectivity. For example, the selective deposition includes a gas flow rate ranging between 10 sccm and 20000 sccm; deposition temperature ranging between 50° C. and 500° C.; and a gas pressure ranging between 0.1 Torr and 50 Torr. In the present embodiment, the pre-treating step and the depositing step are implemented in a same tool, such as a CVD tool with two or more processing chambers.

Thus, the silicon layer 134 is only disposed on the ESL 130, particularly, on the top of the gate stacks 114 and the top of the fin active regions 106, as illustrated in FIG. 5. In some embodiments, the liner layer 132 may be removed after the selective deposition. For example, the liner layer 132 is removed by wet etch using hydrofluoric acid (HF) solution or buffered HF solution.

Figure 6:
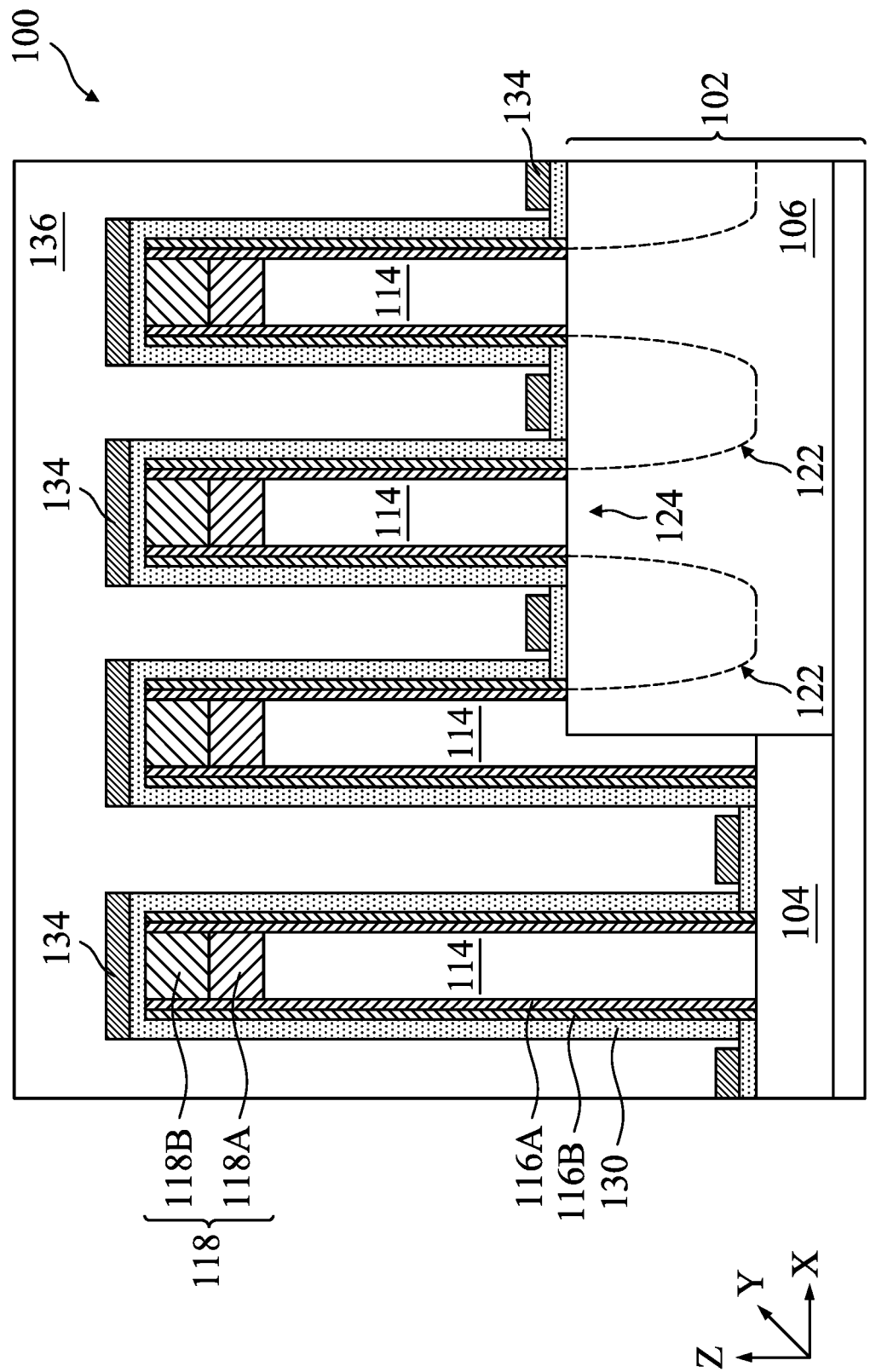

Referring to FIG. 6, an inter-layer dielectric (ILD) layer 136 is formed on the semiconductor structure 100. The ILD layer 136 includes one or more dielectric material to provide isolation functions to various device components. The ILD layer 136 includes a dielectric material, such as silicon oxide, a low-k dielectric material, other suitable dielectric material, or a combination thereof. In some examples, the low-k dielectric material includes fluorinated silica glass (FSG), carbon doped silicon oxide, Xerogel, Aerogel, amorphous fluorinated carbon, Parylene, BCB (bis-benzocyclobutenes), SiLK (Dow Chemical, Midland, Mich.), polyimide, and/or other suitable dielectric materials with dielectric constant substantially less than that of the thermal silicon oxide. The formation of the ILD layer 136 includes deposition and CMP, for examples. The deposition may include spin-on coating, CVD, other suitable deposition technology or a combination thereof. The CMP process may stop on the hard mask 118 using the hard mask as polishing stop layer and then the hard mask is removed by etching. Alternatively, the hard mask 118 may be removed by CMP.

Figure 7:
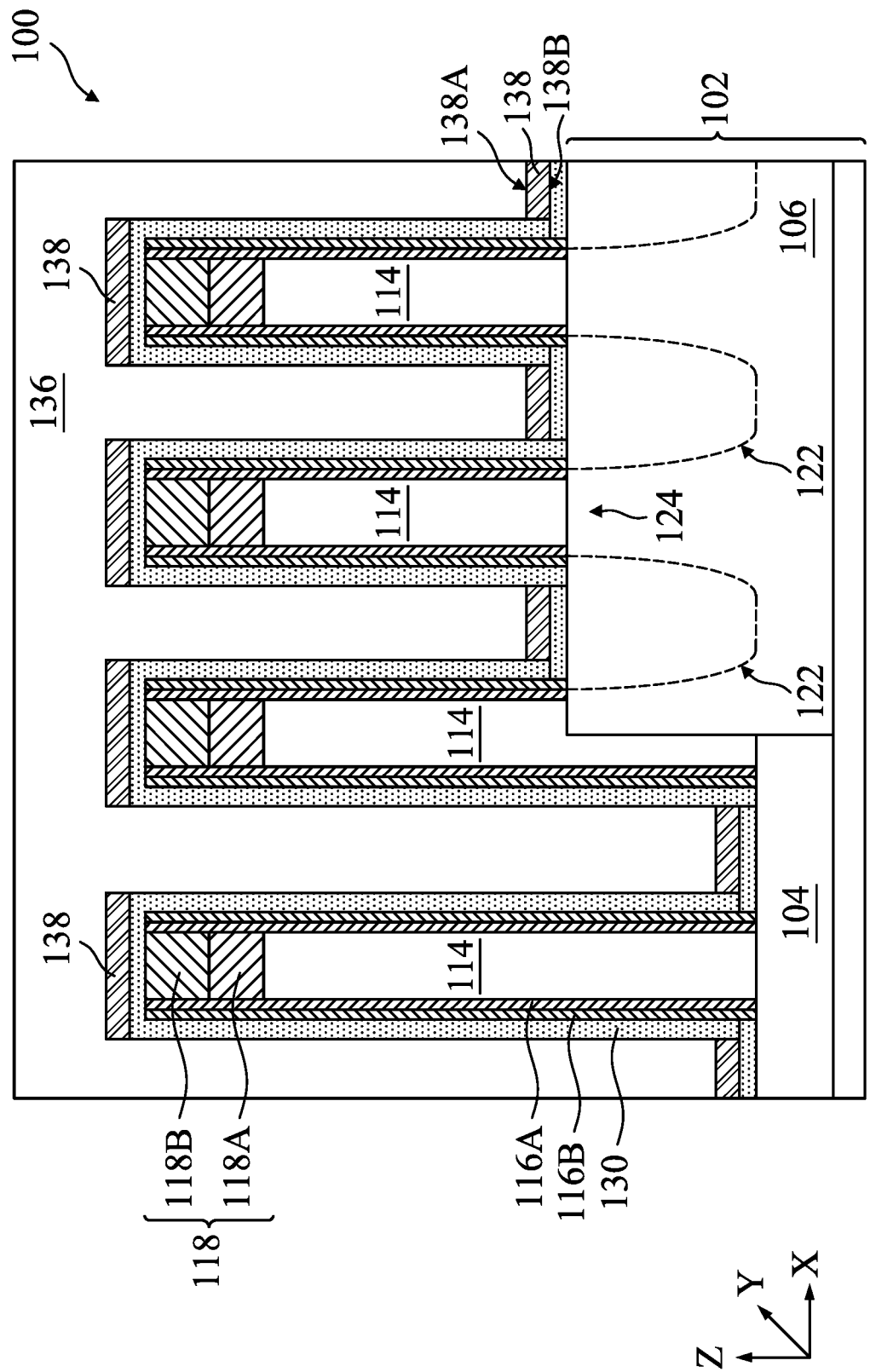
Figure 8:
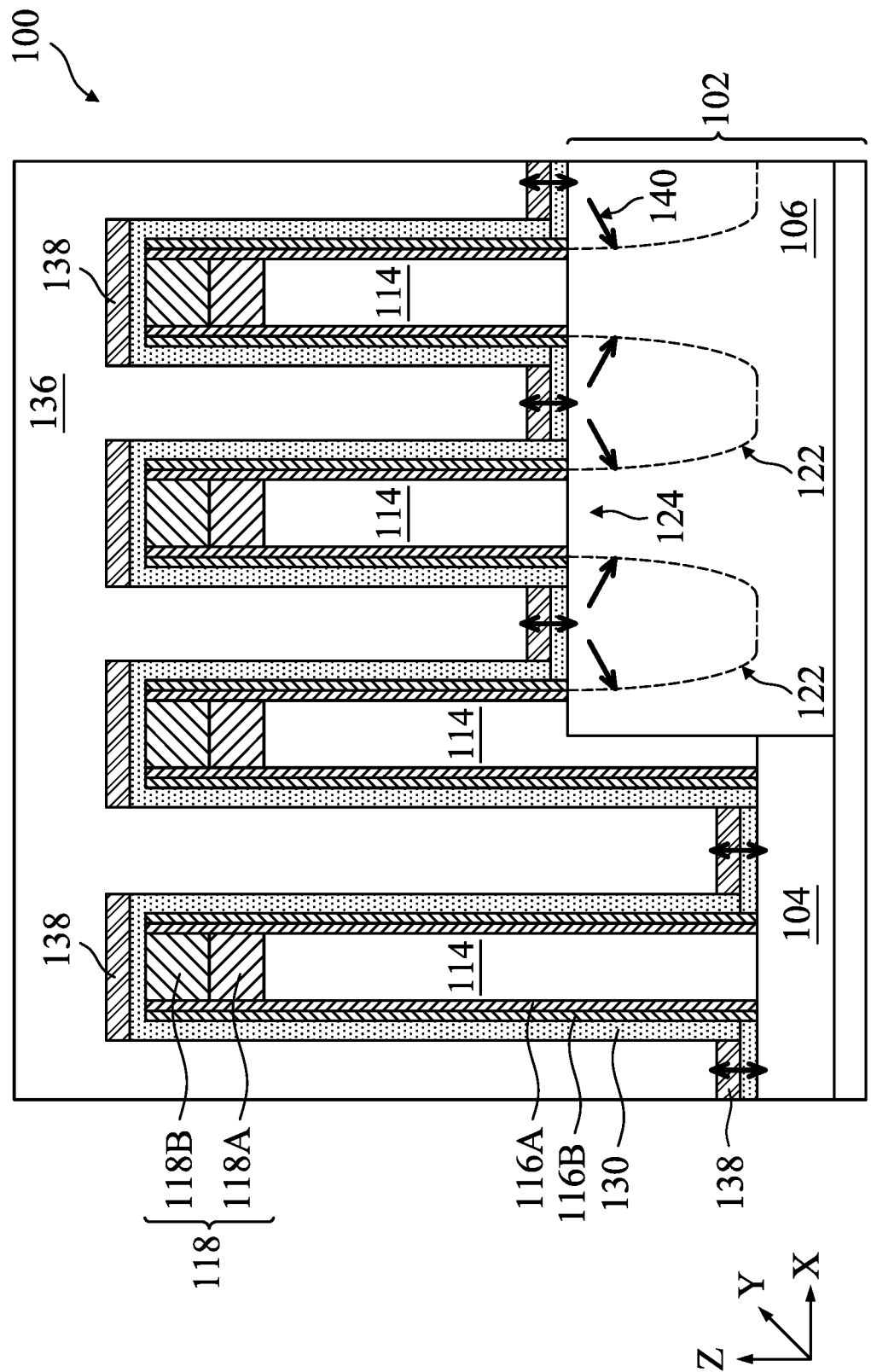

Referring to FIGS. 7 and 8, an annealing process is applied to the semiconductor structure 100 to oxidize the silicon layer 134 into silicon oxide. During the annealing process, oxygen from the ILD layer 136 is reacted with silicon of the silicon layer 134 to form an oxidized layer 138 of silicon oxide. The oxidation causes the volume expansion of the oxidized layer 138 with accompanying stress, which leads to a compressive stress to the channel region 124. Accordingly, this oxidized layer 138 is also referred to as a stress layer (or dielectric stress layer) 138. The compressive stress 140 to the channel region 124 (as illustrated by arrows in FIG. 8) increases the carrier mobility of the corresponding nFETs associated with the stressed channel region 124. Especially, the oxidized layer 138 is present on the substrate 102 within the S/D regions (or gate gaps 120 between the adjacent gate stacks 114) but not present on the sidewalls of the gate stacks 114, which is achieved by the selective deposition with configuration of the ESL 130 and the liner layer 132. This avoids the side effects of the oxidized layer 138. For examples, if the stress layer is present on the sidewalls of the gate stacks 114, it may cause the reduction of the gate dimension and further results in metal gate filling issue. The annealing process is performed in a gas environment of $N_2$, $O_2$, $H_2$, or a combination thereof. In some embodiments, the annealing process includes an annealing temperature ranging between 500° C. and 1000° C., and an annealing duration ranging between 0.5 hours and 5 hours. In some embodiments, due to the diffusion mechanism of oxygen from the ILD layer 136, the dielectric stress layer 138 has a nonuniformly distributed oxygen. In furtherance of the embodiments, the oxygen concentration of the dielectric stress layer 138 is a graded distribution that decreases from the top surface 138A to the bottom surface 138B.

Figure 9:
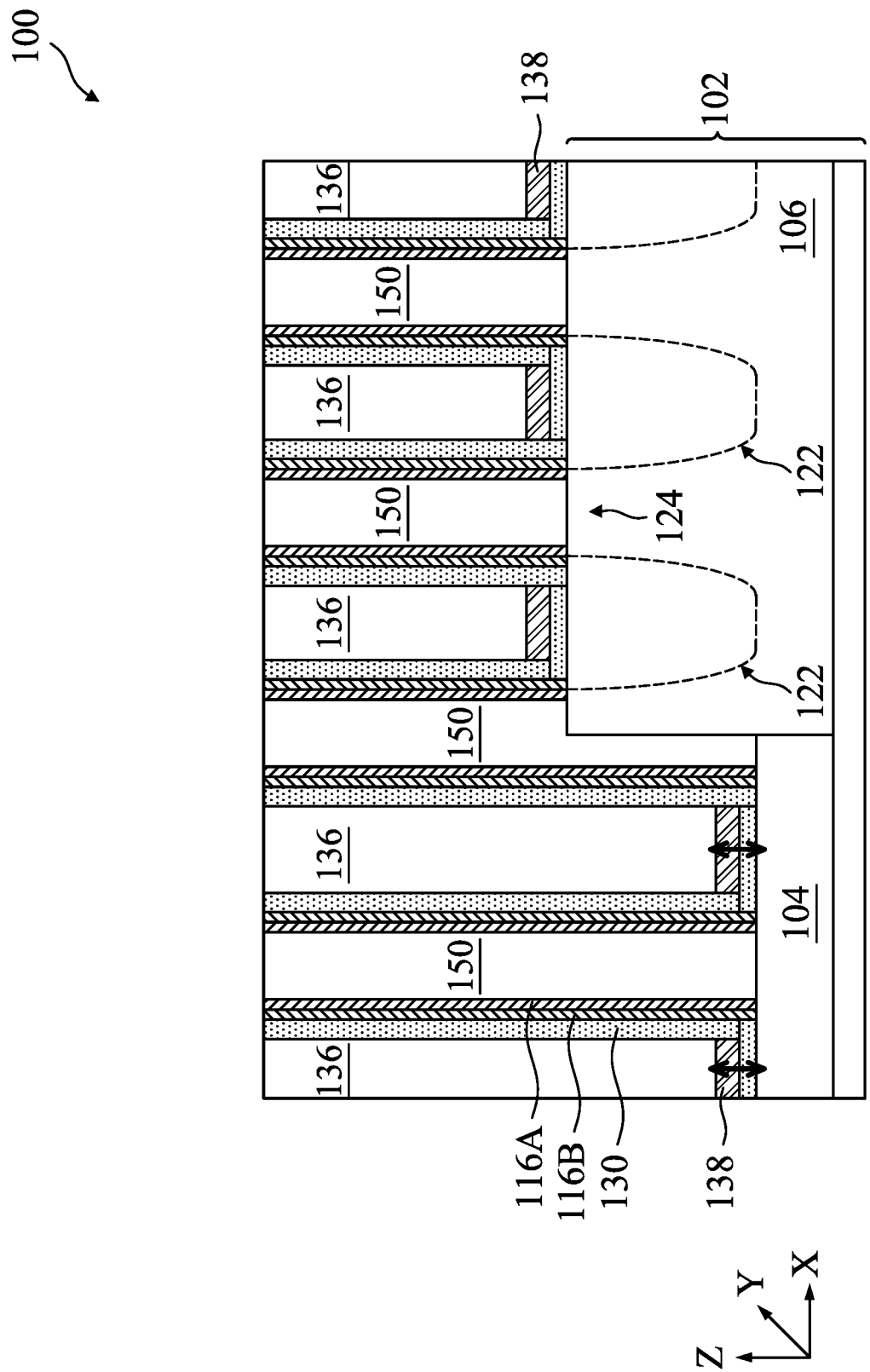

Referring to FIG. 9, a gate-replacement process may be implemented thereafter to form metal gate stacks 150 in place of the dummy gate stacks 114. As noted above, a CMP process may be applied to planarize the top surface during the formation of the ILD layer 136. The CMP process or alternatively an etching process further removes the gate hard mask 118 such that the dummy gate stacks 114 are uncovered by the ILD layer 136 and are exposed for etching. During the gate replacement process, the dummy gate stacks 114 are removed by an etching process, resulting in gate trenches in the ILD layer 136. The etching process may include more than one etching step. Thereafter, various gate materials, including a high-k dielectric material and a metal, are deposited in the gate trenches to form metal gate stacks, which includes a gate dielectric layer having a high-k dielectric material and a gate electrode having a metal or a metal alloy. Another CMP process may be further applied to remove the excessive gate materials on the ILD layer 136 and planarize the top surface as well.

The formation and structure of the gate stacks 150 are further described in detail with reference to FIG. 10. FIG. 10 is a sectional view of the semiconductor structure 100 of FIG. 9, in portion, constructed in accordance with some embodiments.

In FIG. 10, the gate stacks 150 are formed by a gate replacement procedure, also referred to as a gate-last process. In the gate stacks 150, the gate dielectric layer includes a high-k dielectric material layer 152 and may additionally include an interfacial layer 154 interposed between the channel region 124 and the high-k dielectric material layer 152. The high-k dielectric material layer 152 may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), or other suitable dielectric materials. The interfacial layer 154 may include silicon oxide, silicon nitride, silicon oxynitride, and/or other suitable material. The interfacial layer 154 is deposited by a suitable method, such as ALD, CVD, ozone oxidation, etc. The high-k dielectric material layer 152 is deposited on the interfacial layer 154 by a suitable technique, such as ALD, CVD, metal-organic CVD (MOCVD), physical vapor deposition (PVD), thermal oxidation, combinations thereof, and/or other suitable techniques.

The gate stacks 150 further include a gate electrode 156 of metal and/or metal alloy. The gate electrode 156 may include Ti, Ag, Al, TiAlN, TaC, TaCN, TaSiN, Mn, Zr, TiN, TaN, Ru, Mo, Al, WN, Cu, W, Ru, Co, or any suitable conductive materials. In some embodiments, different metal materials are used for nFET and pFET devices with respective work functions to enhance device performance. In some embodiments, the gate electrode 156 may include multiple conductive materials, such as a capping layer 156-1, a blocking layer 156-2, a work function metal layer 156-3, another blocking layer 156-4 and a filling metal layer 156-5, or a subset thereof, as illustrated in FIG. 11. In furtherance of the embodiments, the capping layer 156-1 includes titanium nitride, tantalum nitride, or other suitable material. The blocking layer 156-2 includes titanium nitride, tantalum nitride, or other suitable material. The work functional metal layer 156-3 includes a conductive layer of metal or metal alloy with proper work function such that the corresponding FET is enhanced for its device performance. The work function (WF) metal layer 156-3 is different in composition for a pFET and a nFET, respectively referred to as an p-type WF metal and a n-type WF metal. Particularly, an n-type WF metal is a metal having a first work function such that the threshold voltage of the associated nFET is reduced. The n-type WF metal is close to the silicon conduction band energy (Ec) or lower work function, presenting easier electron escape. For example, the n-type WF metal has a work function of about 4.2 eV or less. A p-type WF metal is a metal having a second work function such that the threshold voltage of the associated pFET is reduced. The p-type WF metal is close to the silicon valence band energy (Ev) or higher work function, presenting strong electron bonding energy to the nuclei. For example, the p-type work function metal has a WF of about 5.2 eV or higher. In some embodiments, the n-type WF metal includes tantalum (Ta). In other embodiments, the n-type WF metal includes titanium aluminum (TiAl), titanium aluminum nitride (TiAlN), or combinations thereof. In other embodiments, the n-metal include Ta, TiAl, TiAlN, tungsten nitride (WN), or combinations thereof. In some embodiments, the p-type WF metal includes titanium nitride (TiN) or tantalum nitride (TaN). In other embodiments, the p-metal include TiN, TaN, tungsten nitride (WN), titanium aluminum (TiAl), or combinations thereof. The work function metal is deposited by a suitable technique, such as PVD. The n-type WF metal or the p-type WF metal may include various metal-based films as a stack for optimized device performance and processing compatibility. As noted above, the gate stacks 150 are for pFETs in the present embodiments. The blocking layer 156-4 includes titanium nitride, tantalum nitride, or other suitable material, formed by a proper deposition technique such as ALD. In various embodiments, the filling metal layer 156-5 includes aluminum, tungsten, copper or other suitable metal. The filling metal layer 156-5 is deposited by a suitable technique, such as PVD or plating. In the furtherance of the embodiment, various films in the gate electrode 156 are U-shaped and extend up to the top surface of the gate stack 150, as illustrated in FIG. 11.

Referring back FIG. 9, the semiconductor structure 100 may further include other features, such as an interconnection structure that further includes metal lines from multiple metal layers to provide horizontal electrical connections; contacts to provide vertical connections from the substrate to the metal lines; and vias to provide vertical connections between metal lines in adjacent metal layers. The contacts include contacts to S/D features and gate contacts to gate electrodes. Furthermore, the above description focuses on the pFETs. Similar operations may applicable to the nFETs. If any material and structural differences, the corresponding features (such as metal gate stacks, S/D features) may be separately formed. Particularly, the stress layer 138 may be patterned such that it is completely removed from the first region 102A for nFETs.

FIGS. 12 and 13 illustrate a flowchart of a method 1200 for making the semiconductor structure 100 in accordance with some embodiments. The method 1200 is described with further reference to FIGS. 1-11. The method 1200 includes an operation 1002 to form isolation features 104 on a substrate 102; an operation 1204 to form fin active regions 106 and form various doped wells, such as the P-well 108 and the N-well 110; an operation 1208 to form dummy gate stacks, such as dummy gate stacks 112 and 114; and an operation 1210 to form S/D features 122, as illustrated in FIG. 2. The operation 1208 also includes forming gate spacer 116 on sidewalls of the dummy gate stacks 112 and 114.

The method 1200 further includes an operation 1212 to deposit an ESL 130 on the semiconductor structure 100, especially on the dummy gate stacks 112 and 114, and the substrate 102, as illustrated in FIG. 2. In some embodiments, the ESL 130 includes silicon nitride. The method 1200 proceeds to an operation 1214 to deposit a liner layer (such as silicon oxide liner layer) 132 on the ESL 130, as illustrated in FIG. 3; and an operation 1216 to perform an anisotropic etching process to remove the portions of the liner layer 132 on the top of the gates and on the substrate 102 within the gate gaps 120, as illustrated in FIG. 4.

The method 1200 proceeds to an operation 1218 to perform a selective deposition to form a silicon layer 134 on the ESL 130 but free from the liner layer 132 on the sidewalls of the dummy gate stacks 114, as illustrated in FIG. 5. The selective deposition is achieved by tuning the deposition condition to have a selective deposition among the silicon nitride surfaces and the silicon oxide surfaces. Alternatively, the ESL 130 and the liner layer 132 may chose other dielectric materials with different compositions as long as the selective deposition can be achievable among those surfaces. The method 1200 further includes an operation 1220 to form an ILD layer 136 on the gate stacks, particularly, on the silicon layer 134.

The method 1200 further includes an operation 1222 to perform an annealing process to the semiconductor structure 100 to oxidize the silicon layer 134 into an oxidized layer 138, thereby expanding the oxidized layer 138 and build stress therein, which further applies a compressive stress to the channel region 124 and enhances carrier mobility of the channel region 124 associated with a pFET. The method 1200 proceeds to an operation 1224 to form metal gate stacks 150 to replace the dummy gate stacks (such as 114) by a gate-replacement process. The method 1200 may include other operations before, during or after the above operations. For example, the method 1200 includes an operation 1226 to form an interconnection structure to couple the S/D features 122, the gate electrodes 156 and other device features to form a functional circuit. The interconnection structure includes multiple metal layers with metal lines for horizontal connection and further includes contact features for connecting devices to the overlying metal lines and via features for vertical connection between adjacent meal layers. The interconnection structure further includes dielectric material(s), such as ILD to provide isolation functions to various conductive features embedded therein. In the present example for illustration. The interconnection structure may be formed by a suitable technology, such as single damascene process, dual damascene process or other suitable process. Various conductive features (contact features, via features and metal lines) may include copper, aluminum, tungsten, silicide, other suitable conductive material or combinations thereof. The ILD may include silicon oxide, low-k dielectric material, other suitable dielectric material or a combination thereof. The ILD may include multiple layers, each further including an etch stop layer (such silicon nitride) to provide etch selectivity. Various conductive features may further include lining layers, such as titanium nitride and titanium, to provide barrier to prevent inter-diffusion, adhesion or other material integration effects.

The present disclosure provides a semiconductor structure having nFET and pFET and a method making the same. Especially, the disclosed method provides a procedure to form a stress layer 138 by oxidizing a silicon layer, therefore expanding and building the stress in the oxidized layer to provide a compressive stress to the channel regions of the pFETs, which increases the carrier mobility and enhances the device performance. Especially, the silicon layer 134 is selectively deposited to avoid the CD reduction of the gate stacks and gate filling issues. This is achieved by the disclosed method to provide different surfaces with desired configuration.

In one example aspect, the present disclosure provides a method that includes forming a gate stack on a semiconductor substrate; forming an etch stop layer on the gate stack and the semiconductor substrate; depositing a dielectric liner layer on the etch stop layer; performing an anisotropic etch to selectively remove portions of the dielectric liner layer such that the etch stop layer is exposed on top surfaces of the gate stack and the semiconductor substrate; depositing a silicon layer selectively on exposed surfaces of the etch stop layer; depositing an inter-layer dielectric (ILD) layer on the gate stack and the semiconductor substrate; and performing an anneal to oxidize the silicon layer, thereby generating a compressive stress to a channel region underlying the gate stack.

In another example aspect, the present disclosure provides a method that includes forming a fin active region and shallow trench isolation features on a semiconductor substrate; forming a gate stack over the fin active region; forming a gate spacer in sidewalls of the gate stack; forming an etch stop layer on a top surface and sidewalls of the gate stack and on the semiconductor substrate; depositing a dielectric liner layer on the etch stop layer; performing an anisotropic etch to selectively remove portions of the dielectric liner layer on sidewalls of the etch stop layer such that the etch stop layer is exposed on the top surface of the gate stack; selectively depositing a silicon layer on exposed portion of the etch stop layer but not on the dielectric liner layer; forming an inter-layer dielectric (ILD) layer on the gate stack and the semiconductor substrate; and performing an anneal to oxidize the silicon layer, thereby generating a compressive stress to a channel region underlying the gate stack.

In yet another example aspect, the present disclosure provides a semiconductor structure that includes a gate stack on a semiconductor substrate; an etch stop layer disposed on the gate stack and the semiconductor substrate, wherein the etch stop layer includes a first portion disposed on sidewalls of the gate stack and a second portion disposed on a top surface of the semiconductor substrate within a source/drain region; and a dielectric stress layer disposed on the second portion of the etch stop layer and being free from the first portion of the etch stop layer. The dielectric stress layer is different from the etch stop layer in composition and has a compressive stress applied to a channel region underlying the gate stack.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure, comprising:
   a gate stack on a semiconductor substrate;
   an etch stop layer disposed on the gate stack and the semiconductor substrate, wherein the etch stop layer includes a first portion disposed on sidewalls of the gate stack and a second portion disposed on a top surface of the semiconductor substrate within a source/drain region; and
   a dielectric stress layer disposed on the second portion of the etch stop layer and being free from the first portion of the etch stop layer other than at a corner area formed by the first portion intersecting the second portion, wherein the dielectric stress layer is different from the etch stop layer in composition and is configured to apply a compressive stress to a channel region underlying the gate stack.

2. The semiconductor structure of claim 1, wherein the dielectric stress layer is a silicon layer doped with oxygen and the etch stop layer includes silicon nitride.

3. The semiconductor structure of claim 2, wherein the dielectric stress layer includes nonuniformly distributed oxygen with a graded oxygen concentration decreasing from a top surface of the dielectric stress layer to a bottom surface of the dielectric stress layer.

4. The semiconductor structure of claim 1, wherein the gate stack is a first gate stack, the semiconductor structure further comprising:
   an active region on the semiconductor substrate;
   an isolation structure surrounding the active region; and
   a second gate stack and a third gate stack disposed on the isolation structure, defining a gap region between the second and the third gate stacks, wherein the etch stop layer is disposed on the isolation structure and the dielectric stress layer is disposed on the etch stop layer within the gap region.

5. The semiconductor structure of claim 4, wherein the etch stop layer is disposed on sidewalls of the second and the third gate stacks and the dielectric stress layer is free from the sidewalls of the second and the third gate stacks.

6. The semiconductor structure of claim 4, wherein the active region includes a fin active region, wherein a first portion of the dielectric stress layer is disposed above a top surface of the fin active region and a second portion of the dielectric stress layer is disposed above a top surface of the isolation structure and below the top surface of the fin active region.

7. The semiconductor structure of claim 6, wherein each of the first and the second portions of the dielectric stress layer includes silicon oxide and has a graded oxygen concentration.

8. The semiconductor structure of claim 1, wherein the channel region underlying the gate stack is part of an nFET.

9. A semiconductor structure, comprising:
   a semiconductor substrate;
   an isolation structure on the semiconductor substrate;
   a fin active region on the semiconductor substrate and protruding above the isolation structure;
   gate stacks on the isolation structure and the fin active region;
   gate spacers on sidewalls of the gate stacks;
   an etch stop layer on sidewalls of the gate stacks, wherein the gate spacers are interposed between the sidewalls of the gate stacks and the etch stop layer;
   an oxidized stress layer disposed on the fin active region and laterally between a first portion of the etch stop layer on the sidewall of a first one of the gate stacks and a second portion of the etch stop layer on the sidewall of a second one of the gate stacks, wherein the oxidized stress layer is different from the etch stop layer in composition and is configured to apply a stress to channel regions underlying the first one of the gate stacks and the second one of the gate stacks; and an inter-layer dielectric layer on the oxidized stress layer.

10. The semiconductor structure of claim 9, wherein the channel regions provide transistor channels for nFET and the oxidized stress layer is configured to apply a compressive stress to the channel regions underlying the first one of the gate stacks and the second one of the gate stacks.

11. The semiconductor structure of claim 9, wherein the oxidized stress layer includes silicon doped with oxygen diffused from the inter-layer dielectric layer.

12. The semiconductor structure of claim 9, wherein a third portion of the etch stop layer is interposed between the oxidized stress layer and the fin active region.

13. The semiconductor structure of claim 12, wherein the oxidized stress layer includes a graded oxygen concentration decreasing from an interface between the oxidized stress layer and the inter-layer dielectric layer to another interface between the oxidized stress layer and the third portion of the etch stop layer.

14. The semiconductor structure of claim 9, wherein a portion of the oxidized stress layer is disposed directly above the isolation structure.

15. The semiconductor structure of claim 9, wherein the etch stop layer includes silicon nitride and both the oxidized stress layer and the inter-layer dielectric layer include oxygen-containing dielectric materials.

16. The semiconductor structure of claim 9, wherein the gate stacks include high-k metal gates.

17. A semiconductor structure, comprising:
a semiconductor substrate;
an isolation structure on the semiconductor substrate;
fin active regions on the semiconductor substrate and protruding above the isolation structure;
gate stacks on the isolation structure and engaging the fin active regions;
gate spacers on sidewalls of the gate stacks;
source/drain features on the fin active regions and on opposite sides of the gate stacks;
an etch stop layer, wherein a first portion of the etch stop layer is disposed on sidewalls of the gate spacer and a second portion of the etch stop layer is disposed on the source/drain features;
a dielectric stress layer disposed on the second portion of the etch stop layer and is substantially free from the first portion of the etch stop layer, wherein the etch stop layer includes a nitride and the dielectric stress layer includes an oxide configured to apply a compressive stress to channel regions in the fin active region; and
an inter-layer dielectric layer on the dielectric stress layer.

18. The semiconductor structure of claim 17, wherein the dielectric stress layer includes a graded oxygen concentration decreasing from an interface between the dielectric stress layer and the inter-layer dielectric layer to another interface between the dielectric stress layer and the second portion of the etch stop layer.

19. The semiconductor structure of claim 17, wherein the gate stacks include high-k metal gates.

20. The semiconductor structure of claim 17, wherein a portion of the dielectric stress layer is disposed directly above the isolation structure.

* * * * *